(12) United States Patent
Liou et al.

(10) Patent No.: US 10,347,716 B2
(45) Date of Patent: Jul. 9, 2019

(54) METHOD FOR FABRICATING SHALLOW TRENCH ISOLATION BETWEEN FIN-SHAPED STRUCTURES

(71) Applicant: UNITED MICROELECTRONICS CORP., Hsin-Chu (TW)

(72) Inventors: En-Chiuan Liou, Tainan (TW);
Chih-Wei Yang, Kaohsiung (TW);
Yu-Cheng Tung, Kaohsiung (TW);
Chun-Yuan Wu, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 15 days.

(21) Appl. No.: 15/786,611

(22) Filed: Oct. 18, 2017

(65) Prior Publication Data
US 2018/0040693 A1 Feb. 8, 2018

Related U.S. Application Data

(62) Division of application No. 14/840,038, filed on Aug. 30, 2015, now Pat. No. 9,991,337.

(30) Foreign Application Priority Data

Aug. 3, 2015 (CN) .......................... 2015 1 0466862

(51) Int. Cl.
| | |
|---|---|
| *H01L 29/66* | (2006.01) |
| *H01L 29/06* | (2006.01) |
| *H01L 29/78* | (2006.01) |
| *H01L 21/762* | (2006.01) |
| *H01L 21/308* | (2006.01) |

(Continued)

(52) U.S. Cl.
CPC ........ *H01L 29/0649* (2013.01); *H01L 21/283* (2013.01); *H01L 21/3081* (2013.01); *H01L 21/31144* (2013.01); *H01L 21/76232* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | |
|---|---|---|
| 4,356,211 A | 10/1982 | Riseman |
| 4,627,152 A | 12/1986 | DeHond et al. |
| | | (Continued) |

OTHER PUBLICATIONS

Chen, Title of Invention: High-Voltage FINFET Device Having LDMOS Structure and Method for Manufacturing the Same, U.S. Appl. No. 14/583,771, filed Dec. 29, 2014.
(Continued)

*Primary Examiner* — Cory W Eskridge
(74) *Attorney, Agent, or Firm* — Winston Hsu

(57) ABSTRACT

A method for fabricating semiconductor device includes the steps of: providing a substrate having a first region and a second region; forming a plurality of fin-shaped structures and a first shallow trench isolation (STI) around the fin-shaped structures on the first region and the second region; forming a patterned hard mask on the second region; removing the fin-shaped structures and the first STI from the first region; forming a second STI on the first region; removing the patterned hard mask; and forming a gate structure on the second STI.

7 Claims, 8 Drawing Sheets

(51) Int. Cl.
*H01L 21/311* (2006.01)
*H01L 21/283* (2006.01)

(56) References Cited

U.S. PATENT DOCUMENTS

| | | |
|---|---|---|
| 5,098,856 A | 3/1992 | Beyer et al. |
| 6,406,975 B1 | 6/2002 | Lim et al. |
| 6,791,155 B1 | 9/2004 | Lo et al. |
| 8,519,481 B2 | 8/2013 | Yuan et al. |
| 8,609,510 B1 | 12/2013 | Banna et al. |
| 8,846,491 B1 | 9/2014 | Pham et al. |
| 8,878,309 B1 | 11/2014 | Hong et al. |
| 2007/0278576 A1 | 12/2007 | Kim |
| 2012/0091538 A1 | 4/2012 | Lin |
| 2013/0187237 A1 | 7/2013 | Yu et al. |
| 2015/0270158 A1* | 9/2015 | Basker .............. H01L 21/76224 257/401 |
| 2015/0311342 A1 | 10/2015 | Lin |

OTHER PUBLICATIONS

Tseng, Title of Invention: Semiconductor Device and Method for Fabricating the Same, U.S. Appl. No. 14/844,004, filed Sep. 3, 2015.

* cited by examiner

METHOD FOR FABRICATING SHALLOW TRENCH ISOLATION BETWEEN FIN-SHAPED STRUCTURES

CROSS REFERENCE TO RELATED APPLICATIONS

This application is a division of U.S. application Ser. No. 14/840,038 filed Aug. 30, 2015, and incorporated herein by reference in its entirety.

BACKGROUND OF THE INVENTION

1. Field of the Invention

The invention relates to a method for fabricating semiconductor device, and more particularly to a method of forming shallow trench isolation (STI) between fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, gate structures are often formed on the shallow trench isolation (STI) between fin-shaped structures as gate structures are fabricated in the active region. These gate structures atop STIs however are typically formed into the substrate, influencing the isolation effect of the STI. Hence, how to improve the current FinFET fabrication and structure for resolving this issue has become an important task in this field.

SUMMARY OF THE INVENTION

According to a preferred embodiment of the present invention, a method for fabricating semiconductor device is disclosed. The method includes the steps of: providing a substrate having a first region and a second region; forming a plurality of fin-shaped structures and a first shallow trench isolation (STI) around the fin-shaped structures on the first region and the second region; forming a patterned hard mask on the second region; removing the fin-shaped structures and the first STI from the first region; forming a second STI on the first region; removing the patterned hard mask; and forming a gate structure on the second STI.

According to another aspect of the present invention, a semiconductor device is disclosed. The semiconductor device includes: a substrate; a fin-shaped structure on the substrate and having a first portion and a second portion; and a shallow trench isolation (STI) between the first portion and the second portion of the fin-shaped structure. Preferably, the STI includes a top portion and a bottom portion, and the top portion is higher than the top surface of the fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
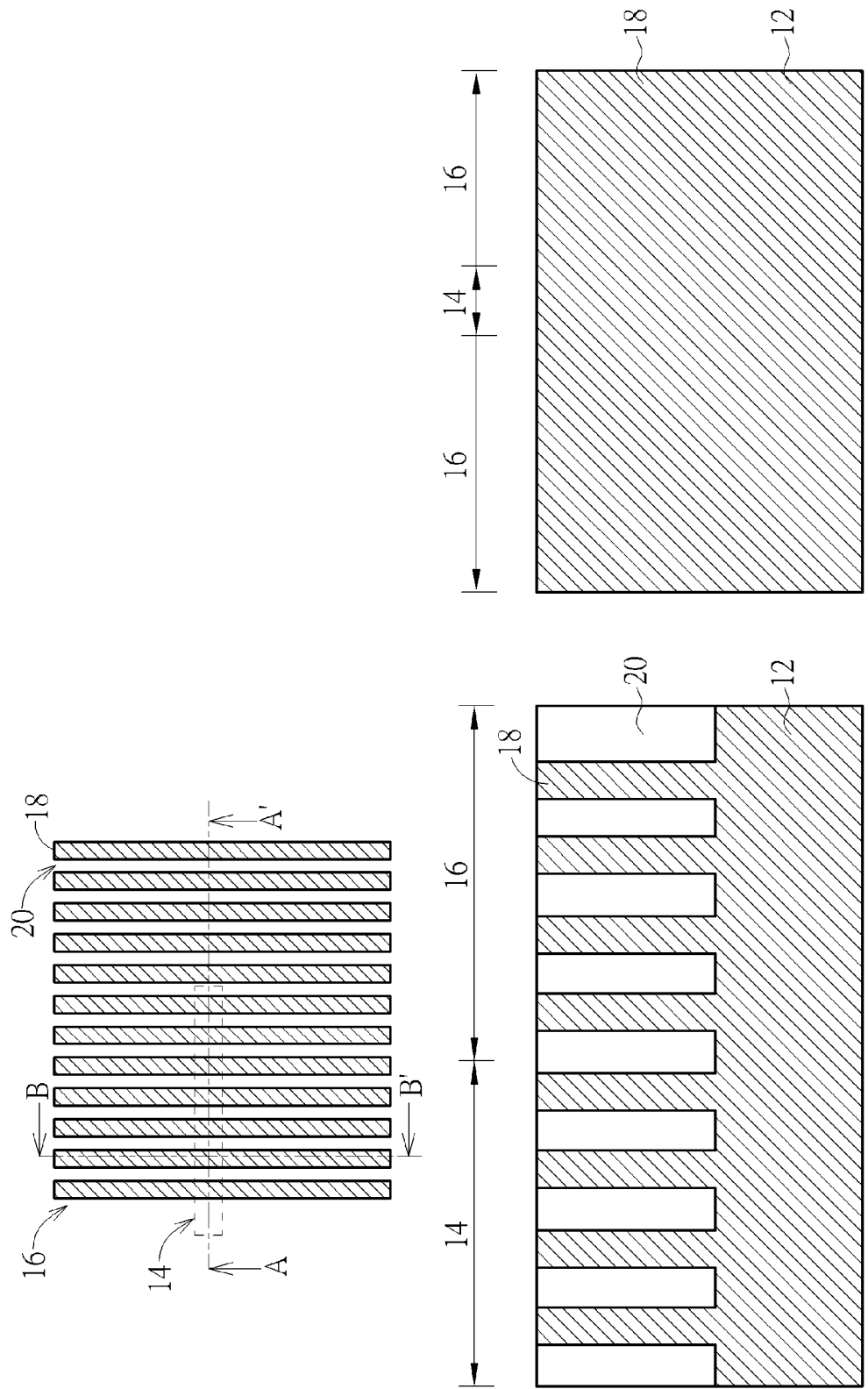
FIGS. 1-6 illustrate a method for fabricating semiconductor device according to a preferred embodiment of the present invention.

Referring to FIGS. 1-6, FIGS. 1-6 illustrate a method for fabricating semiconductor device according to a preferred embodiment of the present invention, in which the top portion of FIG. 1 illustrates a top view of the semiconductor device, the lower left portion illustrates a cross-sectional view of the top portion along the sectional line AA', and the lower right portion illustrates a cross-sectional view of the top portion along the sectional line BB'. As shown in FIG. 1, a substrate 12, such as a silicon substrate or silicon-on-insulator (SOI) substrate is provided, and a first region 14 and a second region 16 are defined on the substrate 12. In this embodiment, the first region 14 is preferably used to form STI between fin-shaped structures while the second region 16 is preferably the region outside the first region 14. A plurality of fin-shaped structures 18 is then formed on the substrate 12, and a STI 20 is formed to surround the fin-shaped structures 18.

The formation of the fin-shaped structure 18 could be accomplished by first forming a patterned mask (now shown) on the substrate, 12, and an etching process is performed to transfer the pattern of the patterned mask to the substrate 12. Next, deposition, chemical mechanical polishing (CMP), and etching back processes are carried out to form a STI 20 surrounding the bottom of the fin-shaped structure 18. Next, depending on the structural difference of a tri-gate transistor or dual-gate fin-shaped transistor being fabricated, the patterned mask could be selectively removed or retained. In this embodiment, it would be desirable to first remove the patterned mask so that the top surface of each fin-shaped structure 18 is even with the top surface of the STI. Alternatively, the formation of the fin-shaped structure 18 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 18. Similarly, the patterned hard mask could be removed selectively or retained, and deposition, CMP, and then etching back could be used to form a STI surrounding the bottom of the fin-shaped structure 18. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

Figure 2:
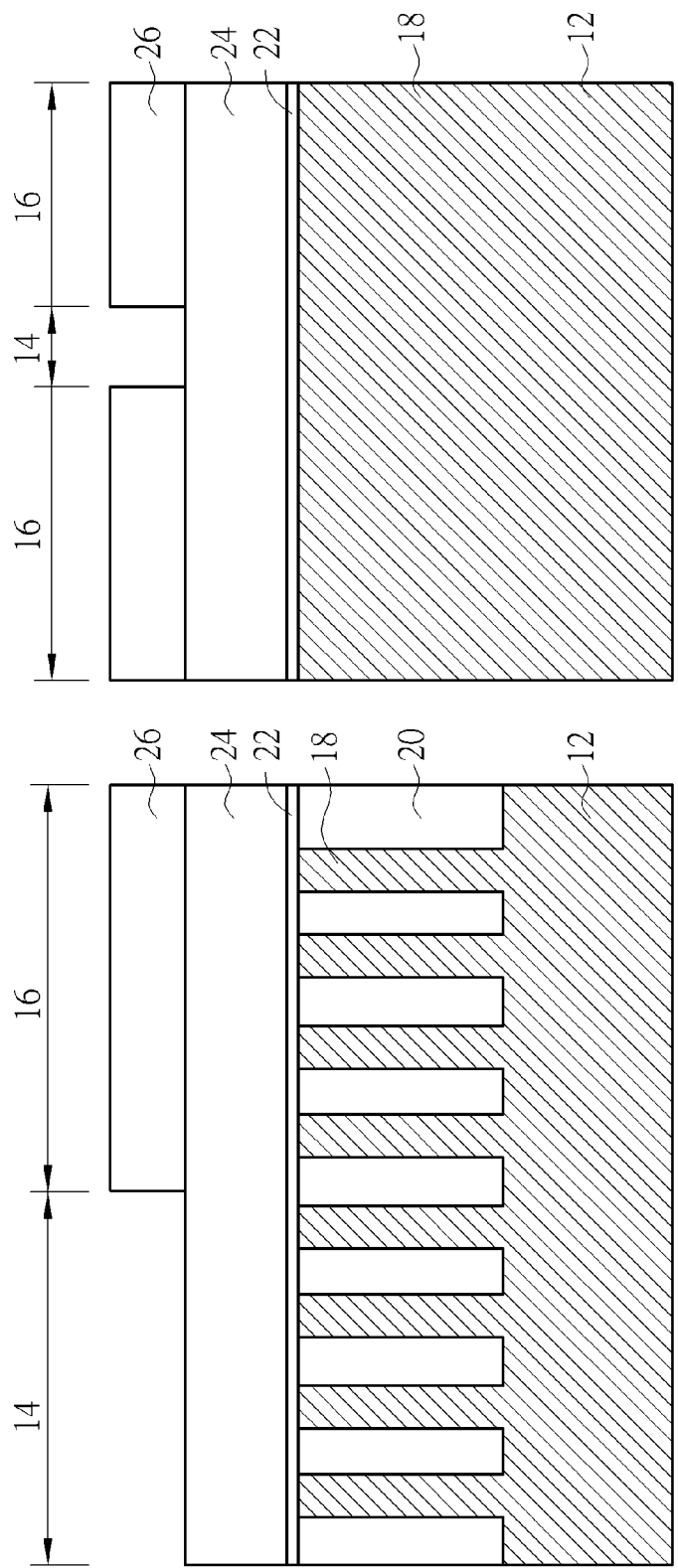

Next, as shown in FIG. 2, a buffer layer 22 and a hard mask 24 are formed to cover the STI 20 and fin-shaped structures 18, and another patterned mask, such as patterned resist 26 is formed on the hard mask 24 to expose the hard mask 24 surface on first region 14. In this embodiment, the buffer layer 22 is composed of silicon oxide and the hard mask 24 is composed of silicon nitride, but not limited thereto.

Figure 3:
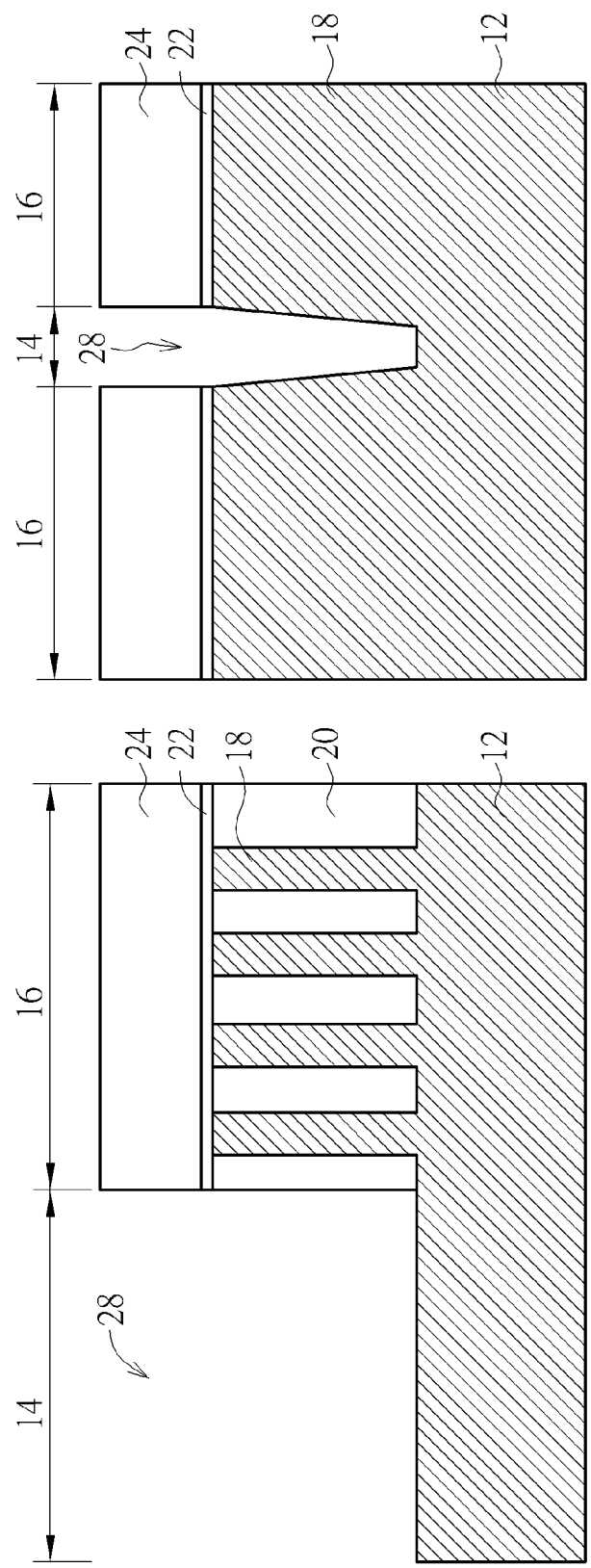

Next, as shown in FIG. 3, at least one etching process is conducted by using the patterned resist 26 as mask to remove the hard mask 24, buffer layer 22, fin-shaped structures 18, and STI 20 on the first region 14. This forms a recess 28 to expose the substrate 12 surface on first region 14, in which the hard mask 24 is partially removed during the aforementioned etching process to form into a patterned hard mask 24 on the STI 20 and fin-shaped structures 18 on the second region 16. Viewing from another perspective as shown in the right portion of FIG. 3, the etching process conducted by using the patterned resist 26 as mask preferably divides part of the fin-shaped structure 18 into two portions while the recess 28 is formed between the divided fin-shaped structure 18.

Figure 4:
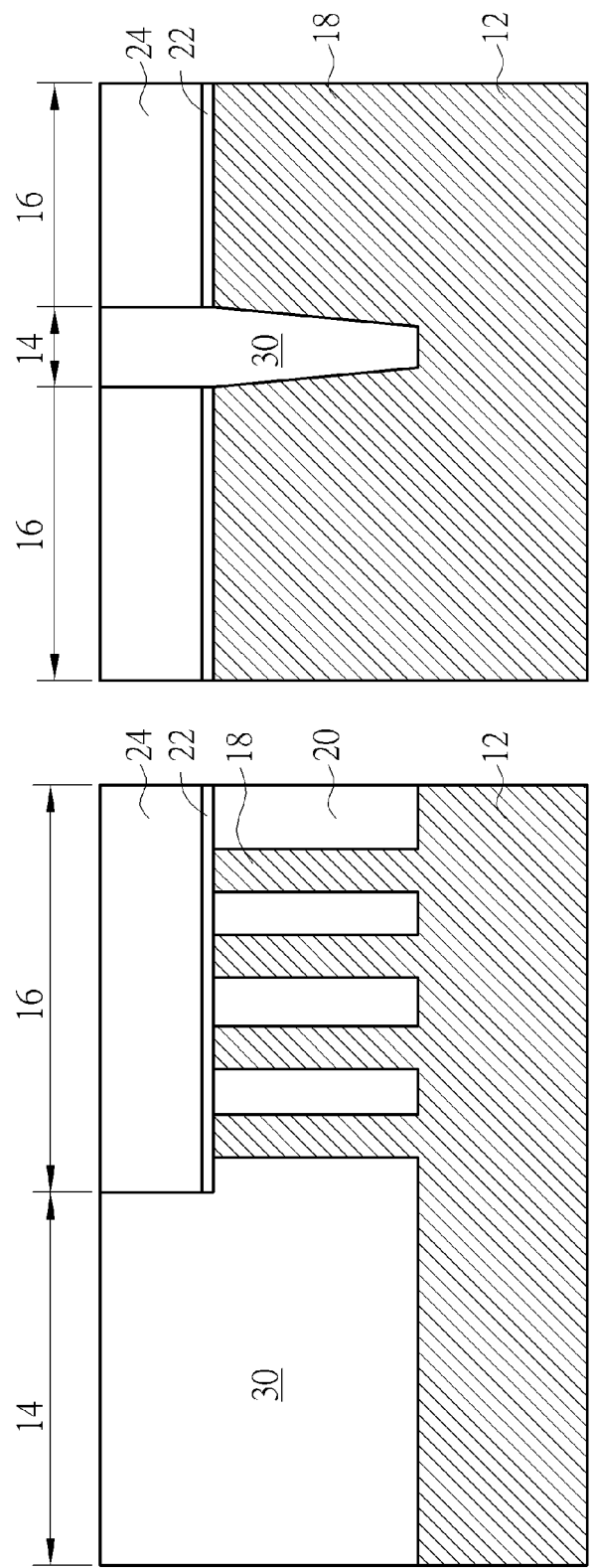

Next, as shown in FIG. 4, insulating material is deposited into the recess 28 to form another STI 30 on the first region 14. In this embodiment, the formation of the STI 30 could be accomplished by first depositing an insulating material (not shown) composed of silicon oxide in the recess 28 on first region 14 and on top of the patterned hard mask 24 on second region 16, and then using CMP process to remove part of the insulating material or even part of the patterned hard mask 24 so that the top surfaces of the insulating material and patterned hard mask 24 are coplanar. This forms a STI 30 on the first region 14.

Figure 5:
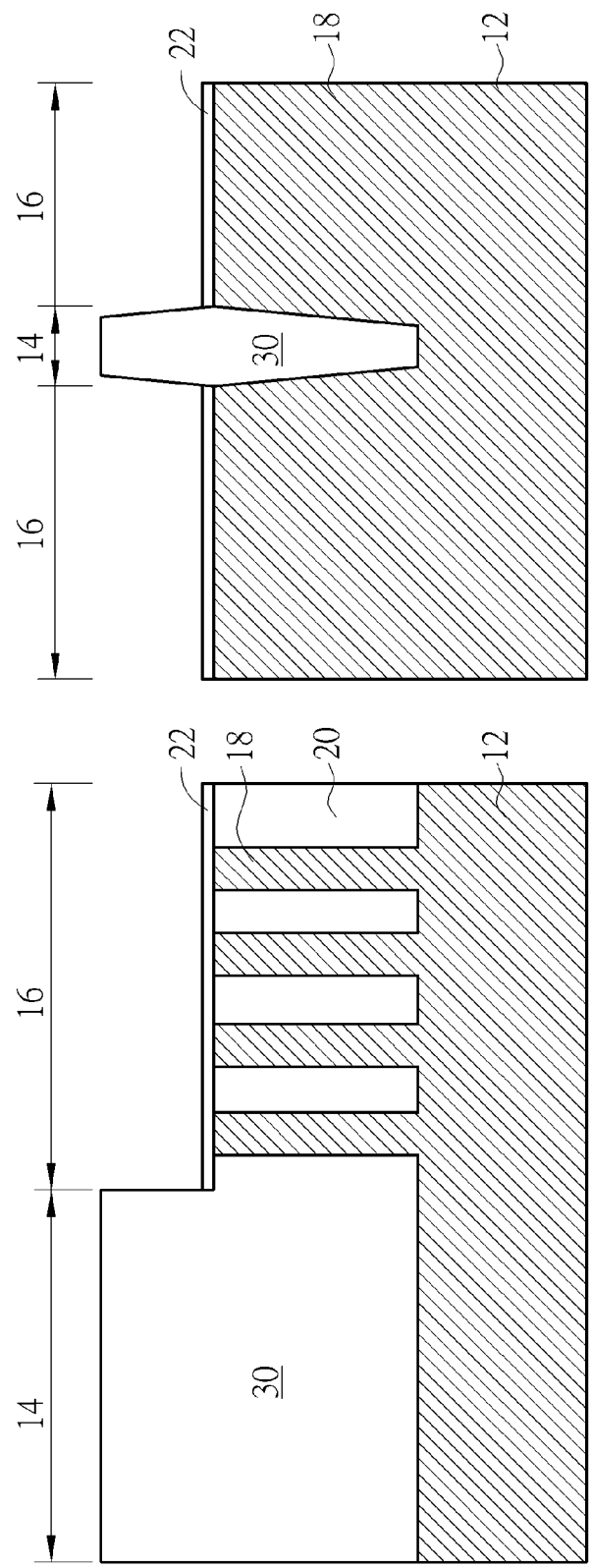

Next, as shown in FIG. 5, an etching process is conducted to remove the patterned hard mask 24 from the second region 16 and expose the buffer layer 22 underneath. According to a preferred embodiment of the present invention, as shown in the cross-sectional view on the right hand side of FIG. 5, the STI 30 on the first region 14 preferably protrudes from the fin-shaped structure 18 after the patterned hard mask 24 is removed.

Figure 6:
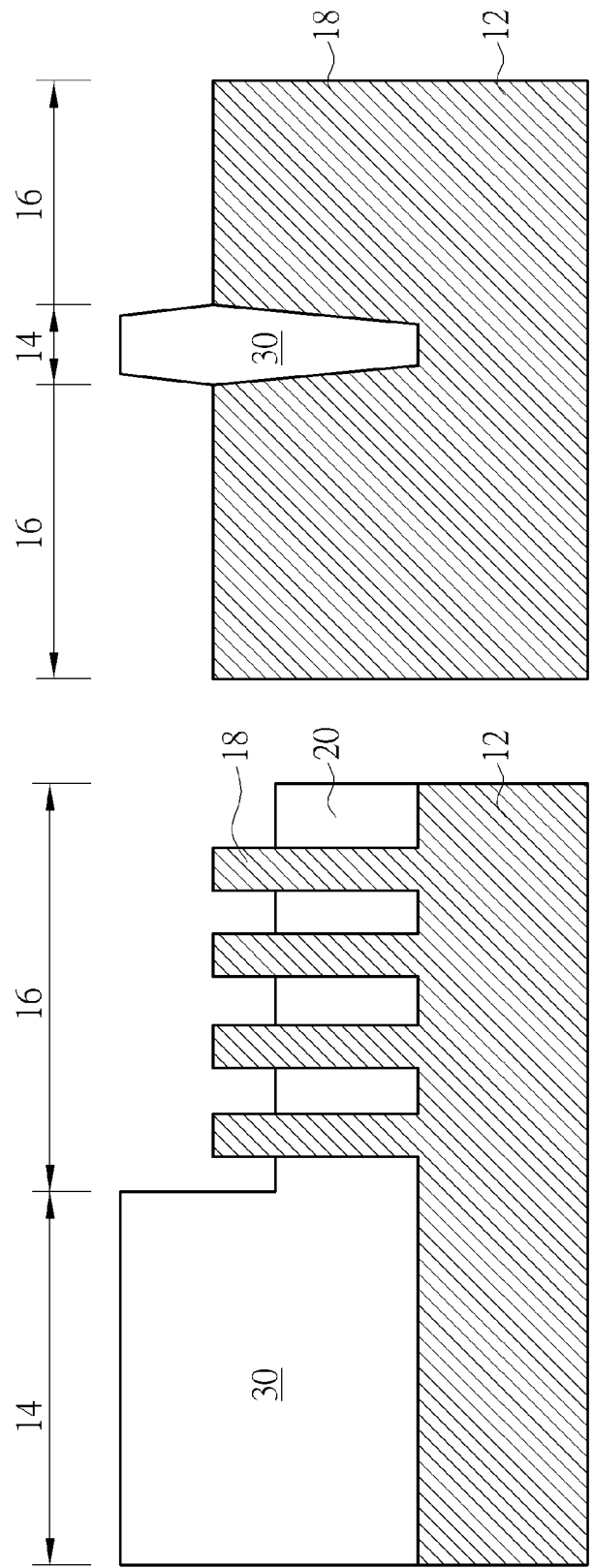

Next, as shown in FIG. 6, another etching is conducted to remove part of the STI 30 on both first region 14 and second region 16 so that the fin-shaped structures 18 on second region 16 would protrude from the STI 30 surface while the STI 30 on first region 14 still protrude from the fin-shaped structure 18 surface.

Figure 7:
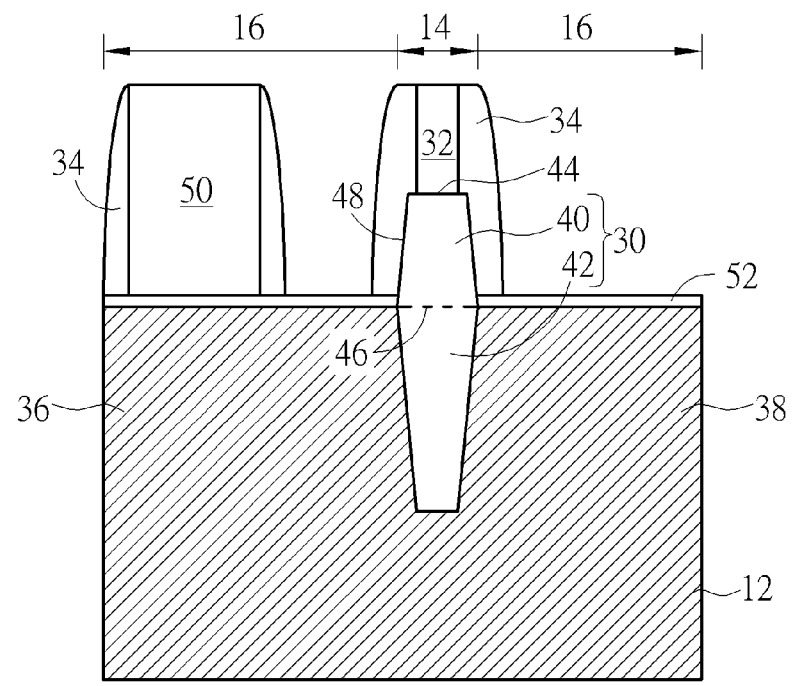
FIGS. 7-9 illustrate a method for fabricating a gate structure on the STI according to different embodiments of the present invention.
Figure 8:
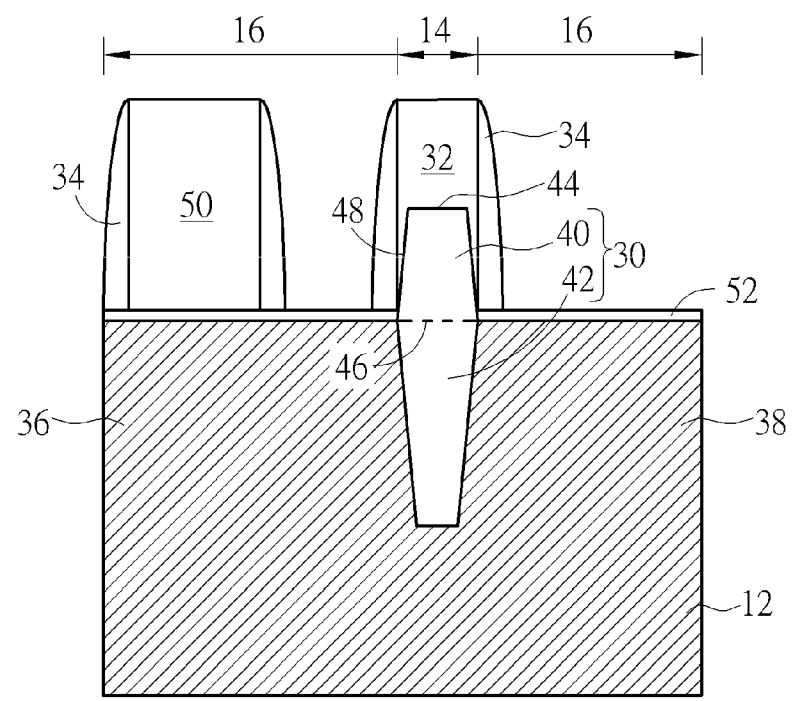
Figure 9:
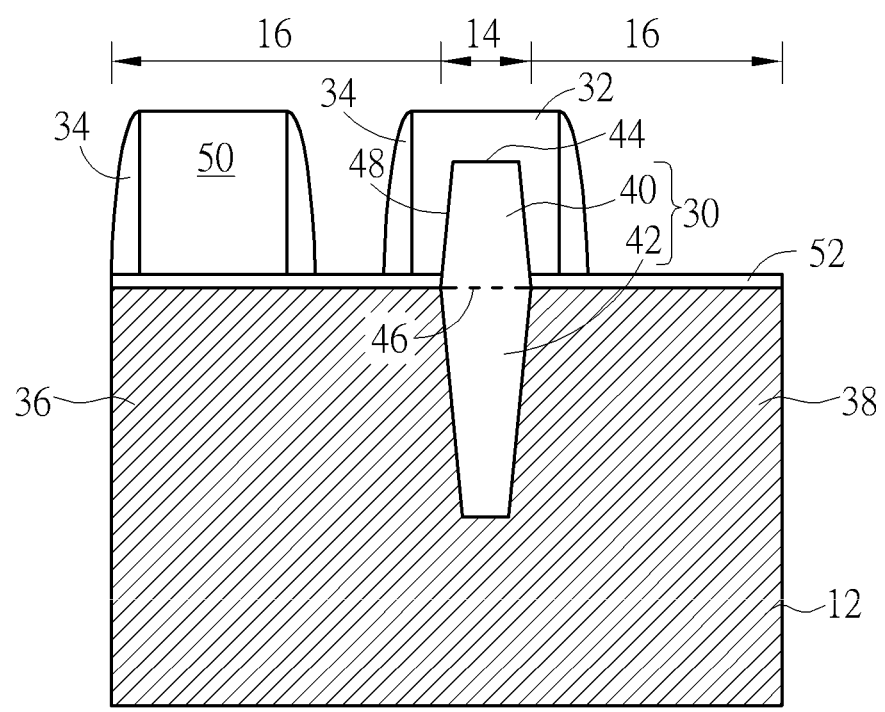

Referring to FIGS. 7-9, FIGS. 7-9 illustrate different embodiments of forming a gate structure on the STI 30 after STI 30 were formed to protrude from the fin-shaped structure 18 surface, in which each of the figures from FIGS. 7-9 illustrate a cross-sectional view of FIG. 1 along the sectional line BB'. A shown in FIGS. 7-9, an oxide layer 52 could be selectively formed on the fin-shaped structure 18, and a gate structure formation process is carried out to form a dummy gate or gate structure 32 on the STI 30 of first region 14 and a dummy gate or gate structure 50 on the fin-shaped structure 18 of second region 16, in which both the gate structures 32 and 50 are composed of polysilicon. A spacer 34 is then formed on the sidewalls of each of the gate structures 32 and 50. In this embodiment, different embodiments of gate structures 32 formed on the STI 30 is revealed, such as the gate structure 32 shown in FIG. 7 is disposed only on the STI 30 without passing or overlapping the sidewalls of the STI 30, the gate structure 32 shown in FIG. 8 is disposed on the STI 30 and aligned with the sidewalls of the STI 30, or the gate structure 32 shown in FIG. 9 is formed on both STI 30 and part of the fin-shaped structure 18 at the same time.

In this embodiment, the fin-shaped structure 18 after being processed by the etching process in FIG. 3 is divided into a first portion 36 and a second portion 38, the STI 30 is disposed between the first portion 36 and the second portion 38, the STI 30 includes a top portion 40 and a bottom portion 42, and the top portion 40 is higher than the top surface of the fin-shaped structure 18. Specifically, each of the top portion 40 and bottom portion 42 of the STI 30 includes a substantially trapezoid shaped cross-section. For instance, the trapezoid shaped cross-section of the top portion 40 includes a top surface 44, a bottom surface 46, and two inclined sidewalls 48, in which the width of the top surface 44 is less than the width of the bottom surface 46.

As shown in the embodiment revealed in FIG. 7, the gate structure 32 is disposed on the top surface 44 of the STI 30 without overlapping the two inclined sidewalls 48. The width of the gate structure 32 is preferably less than or equal to the width of the top surface 44. The spacer 34 adjacent to the gate structure 32 is sitting on the top surface 44 and two inclined sidewalls 48, or could even pass through the two inclined sidewalls 48 to sit on the first portion 36 and second portion 38 of the fin-shaped structure 18.

As shown in the embodiment revealed in FIG. 8, the gate structure 32 is disposed on the top surface 44 of the STI 30 and the two inclined sidewalls 48 of the top portion 40, in which the sidewalls of the gate structure 32 are also aligned with the intersecting spot of the inclined sidewalls 48 and fin-shaped structure 18. The spacer 34 adjacent to the gate structure 32 is preferably disposed on the first portion 36 and second portion 38 of the fin-shaped structure 18. As shown in the embodiment revealed in FIG. 9, the gate structure 32 is disposed on the top surface 40 of the STI 30, two inclined sidewalls 48, and also on top of the first portion 36 and second portion 38 of the fin-shaped structure 18. The spacer 34 adjacent to the gate structure 32 is disposed on the fin-shaped structure 18.

It should be noted that since the gate structure 50 on the second region 16 and the gate structure 32 on the STI 30 or on first region 14 are formed at the same time, the gate structures 50 and 32 are preferably made of same material, and the top surface of the gate structure 50 on second region 16 is preferably even with the top surface of the gate structure 32 on first region 14 or on STI 30.

Next, FinFET process could be conducted by forming a source/drain region and/or epitaxial layer in the fin-shaped structure 18 adjacent to two sides of the spacer 34, selectively forming a silicide (not shown) on the source/drain region and/or epitaxial layer, forming a contact etch stop layer (CESL) on the gate structure or dummy gate, and forming an interlayer dielectric (ILD) layer on the CESL. Next, a replacement metal gate (RMG) process could be conducted to planarize part of the ILD layer and CESL and then transform the gate structures 32 and 50 composed of polysilicon into metal gates. Since the RMG process is well known to those skilled in the art, the details of which are not explained herein for the sake of brevity. This completes the fabrication of a semiconductor device according to a preferred embodiment of the present invention.

Overall, the present invention discloses an approach of forming STI between two fin-shaped structures, which preferably uses a patterned hard mask to remove part of the fin-shaped structure and part of STI on the substrate to form a recess, and then deposits insulating material into the recess to form another STI. After removing the patterned hard mask, the top surface of the newly formed STI would be higher than the top surface of the adjacent fin-shaped structure. Since the STI between fin-shaped structure is higher than the top surfaces of adjacent fin-shaped structures, the gate structure formed afterwards could be disposed directly on top of the fin-shaped structure so that the isolation effect of the STI is not compromised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region;
   forming fin-shaped structures extending along a first direction and a first shallow trench isolation (STI) around the fin-shaped structures on the first region and the second region;
   forming a patterned hard mask on the second region;
   removing the fin-shaped structures and the first STI on the first region;
   forming a second STI extending along a second direction on the first region, wherein the second STI divides the fin-shaped structures into a first portion and a second portion and the first direction is perpendicular to the second direction;
   removing the patterned hard mask; and
   forming a gate structure on the second STI.

2. The method of claim 1, further comprising forming a buffer layer on the fin-shaped structures and the first STI before forming the patterned hard mask.

3. The method of claim 2, further comprising removing the buffer layer and part of the first STI on the second region after removing the patterned hard mask.

4. The method of claim 3, wherein a top surface of the first STI is lower than a top surface of the fin-shaped structures after removing the buffer layer and part of the first STI.

5. The method of claim 1, wherein the patterned hard mask comprises silicon nitride.

6. The method of claim 1, further comprising forming the second STI on the first region so that the top surfaces of the second STI and the patterned hard mask are coplanar.

7. The method of claim 1, wherein a top surface of the second STI is higher than a top surface of the first STI.

* * * * *